(12) United States Patent
Ikejiri

(10) Patent No.: US 8,414,977 B2
(45) Date of Patent: Apr. 9, 2013

(54) MASKING JIG, SUBSTRATE HEATING DEVICE, AND COATING METHOD

(75) Inventor: Takashi Ikejiri, Miyoshi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/133,271

(22) PCT Filed: May 10, 2010

(86) PCT No.: PCT/JP2010/057856
§ 371 (c)(1),
(2), (4) Date: Jun. 7, 2011

(87) PCT Pub. No.: WO2011/141979
PCT Pub. Date: Nov. 17, 2011

(65) Prior Publication Data
US 2012/0148738 A1    Jun. 14, 2012

(51) Int. Cl.
*B05D 1/32* (2006.01)
*B05C 19/00* (2006.01)

(52) U.S. Cl.
USPC .......................................... 427/282; 427/468

(58) Field of Classification Search ............ 427/282, 427/468; 118/504, 505
See application file for complete search history.

(56) References Cited

U.S. PATENT DOCUMENTS 3,800,697 A * 4/1974 Sullivan ...................... 101/128.1
4,373,441 A * 2/1983 Messerschmitt ........... 101/127.1

FOREIGN PATENT DOCUMENTS

| JP | 06-262106 A | 9/1994 |
| JP | 07-300664 A | 11/1995 |
| JP | 2000-282219 A | 10/2000 |
| JP | 2003-117452 A | 4/2003 |
| JP | 2006-218460 A | 8/2006 |
| JP | 2006-278558 A | 10/2006 |
| JP | 2008-174786 A | 7/2008 |
| JP | 2008-302317 A | 12/2008 |
| JP | 2009-235427 A | 10/2009 |

OTHER PUBLICATIONS

International Search Report of PCT/JP2010/057856 issued Jun. 1, 2010.

* cited by examiner

*Primary Examiner* — Frederick Parker
(74) *Attorney, Agent, or Firm* — Kenyon & Kenyon LLP

(57) ABSTRACT

A masking jig for specifying a coating region on which a coating is formed by spraying copper powder onto a front surface of an insulating substrate from a cold spray device. This masking jig includes a metal member formed with an opening for specifying the coating region and placed in contact with the front surface of the insulating substrate. The metal member internally includes a heating wire is provided to heat the vicinity of the opening. A cooler is connected to a back surface of the insulating substrate.

7 Claims, 4 Drawing Sheets

US 8,414,977 B2

MASKING JIG, SUBSTRATE HEATING DEVICE, AND COATING METHOD

This is a 371 national phase application of PCT/JP2010/057856 filed May 10, 2010, the contents of which are incorporated herein by reference.

TECHNICAL FIELD

The present invention relates to a masking jig for specifying or defining a coating region on a front surface of a substrate constituting a power module when a coating is to be formed in the coating region by spraying material powder onto the surface, and a substrate heating device for heating the substrate. The present invention further relates to, a coating method for forming the coating by spraying the material powder from a spray device onto the front surface of the substrate.

BACKGROUND ART

As the aforementioned coating method, there is recently proposed a cold spray method, for example. This cold spray method is a process for forming a coating on a front surface of a substrate by use of a spray device arranged to discharge a jet of material powder (particles) at high velocities from a nozzle together with working gas heated to a temperature lower than a melting point or a softening temperature of the material powder, thereby causing the material powder in solid state impact or collide against the front surface of the substrate. This cold spray method does not need to heat the material powder to high temperatures as compared with a thermal spraying method in which material powder is sprayed in melted or softened state onto a front surface of a substrate at high velocities. Accordingly, it is possible to prevent the property of the material powder from deteriorating due to oxidization and others and hence to form a coating with high adhesion with respect to the front surface of the substrate.

The above cold spray method is disclosed in for example Patent Literature 1 listed below. In this cold spray method, as shown in FIG. 4, a heating plate 111 is connected to a back surface 110b of a substrate 110, and a heater 112 for heating the heating plate 111 is provided. Patent Literature 1 listed below also discloses a modified example in which a front surface 110a of the substrate 110 is heated by a laser. Accordingly, material powder (particles) 121 sprayed from a cold spray device 120 collides against the front surface 110a of the heated substrate 110. Due to this collision, the material powder 121 and the front surface 110a of the substrate 110 are deformed. As a result, an adhesion rate of the material powder 121 to the front surface 110a of the substrate 110 and adhesion strength thereof can be improved and further a coating 130 of the material powder 121 can be formed compactly.

CITATION LIST

Patent Literature

Patent Literature 1: JP2008-302317A

SUMMARY OF INVENTION

Technical Problem

Meanwhile, in a power module 200 serving as a component of an inverter to convert electric power, as schematically shown in FIG. 5, a semiconductor device 212 such as IGBT is connected to a front surface 210a of an insulating substrate 210 through solder 211. On a back surface 210b of the insulating substrate 210, a cooler (a radiator) 220 for radiating the heat generated by switching of the semiconductor device 212 is connected through a stress relaxation material 213.

In a process of manufacturing such power module 200, the cooler 220 is connected in advance to the back surface 210b of the insulating substrate 210. By use of a masking jig for specifying a range in which the material powder is to be sprayed, the material powder in solid state is sprayed from the cold spray device onto the front surface 210a of the substrate 210. Accordingly, a coating 230 is formed on the front surface 210a of the substrate 210 and then the semiconductor device 212 is joined onto the coating 230 through the solder 211. Forming the coating 230 of the material powder on the front surface 210a of the substrate 210 is intended to enhance wettability of the solder 211 to facilitate joining of the semiconductor device 212 to the front surface 210a of the substrate 210.

In the aforementioned manufacturing process, when the coating 230 is to be formed on the front surface 210a of the insulating substrate 210, the cooler 220 is connected in advance to the back surface 210b of the insulating substrate 210. Thus, the heating plate 111 and the heater 112 could not be placed under the back surface 210b of the substrate 210 as shown in FIG. 4 to heat the substrate 210. In the case where the substrate 210 is to be heated by radiation, the substrate 210 could not be sufficiently heated and a large heat loss is caused by the cooler 220. Furthermore, when the front surface 110a of the insulating substrate 110 is to be heated by use of the laser, such expensive device is additionally needed. Thus, a low-cost structure could not be achieved.

The present invention has been made to solve the above problems and has a purpose to provide a masking jig, a substrate heating device, and a coating method, capable of spraying material powder from a spray device onto a front surface of a substrate heated by a low-cost structure while a back surface of the substrate is connected to a radiator.

Solution to Problem

To achieve the above purpose, one aspect of the invention provides a masking jig for specifying a coating region on a front surface of a substrate including a back surface connected to a radiator and constituting a power module, when a coating is to be formed in the coating region by spraying material powder in solid state from a spray device onto the surface, the masking jig comprising: a contact member formed with an opening to specify the coating region, the contact member being to be placed in contact with the front surface of the substrate, and the contact member internally including a heating device for heating the vicinity of the opening. Herein, the vicinity of the opening indicates a portion of the contact member overlapping the substrate in plan view.

In the masking jig in the above aspect of the invention, preferably, an insulating member for restraining heat transfer is placed over the contact member in a direction of thickness of the substrate.

In the masking jig in the above aspect of the invention, preferably, the contact member includes a planar portion formed with the opening and a side portion extending from the planar portion in the thickness direction of the substrate and surrounding the substrate, and the heat generating device is placed in the planar portion and the side portion.

In the masking jig in the above aspect of the invention, preferably, the contact member is formed with a plurality of the openings in correspondence with a plurality of the substrates connected to the single radiator, and the heat generating device is located to heat the vicinity of each opening.

A second aspect of the invention provides a substrate heating device for heating a substrate including a back surface connected to a radiator and constituting a power module when a coating is to be formed on a front surface of the substrate by spraying material powder in solid state from a spray device onto the surface, the heating device comprising: a masking jig includes a contact member formed with an opening for specify a coating region in which the coating is to be formed, the contact member being placed in contact with the front surface the vicinity of the opening; a power source for supplying current to the heating wire; and a control device for controlling the power source.

In the substrate heating device in the above aspect of the invention, preferably, the contact member is formed with a plurality of the openings in correspondence with a plurality of the substrates connected to the single radiator, and the heat generating device is located to heat the vicinity of each opening.

A third aspect of the invention provides a coating method for forming a coating on a front surface of a substrate including a back surface connected to a radiator and constituting a power module by spraying material powder in solid state from a spray device onto the front surface of the substrate, the method comprising the steps of: placing a masking jig in contact with the front surface of the substrate, the masking jig being formed with an opening for specifying a coating region in which the coating is to be formed, the masking jig internally including a heat generating device to heat the vicinity of the opening; causing the heat generating device to heat the vicinity of the opening; and causing the spray device to spray the material powder onto the front surface of the heated substrate.

In the coating method in the above aspect, preferably, the masking jig is formed with a plurality of the openings in correspondence with a plurality of the substrates connected to the single radiator, and the heat generating device heats the vicinity of each opening.

Advantageous Effects of Invention

According to the invention, when the coating is to be formed of the material powder on the front surface of the substrate, the heat generating device located internally in the masking jig heats the vicinity of the opening, thereby heating the front surface of the insulating substrate in contact with the masking jig. Accordingly, while the front surface of the substrate is being heated by a low-cost structure and the back surface of the substrate is in connection to the radiator, the material powder is sprayed from the spray device onto the front surface of the substrate. As a result, an adhesion rate of the material powder to the front surface of the substrate and adhesion strength thereof can be enhanced and the coating of the material powder can be formed compactly.

DESCRIPTION OF EMBODIMENTS

Figure 1:
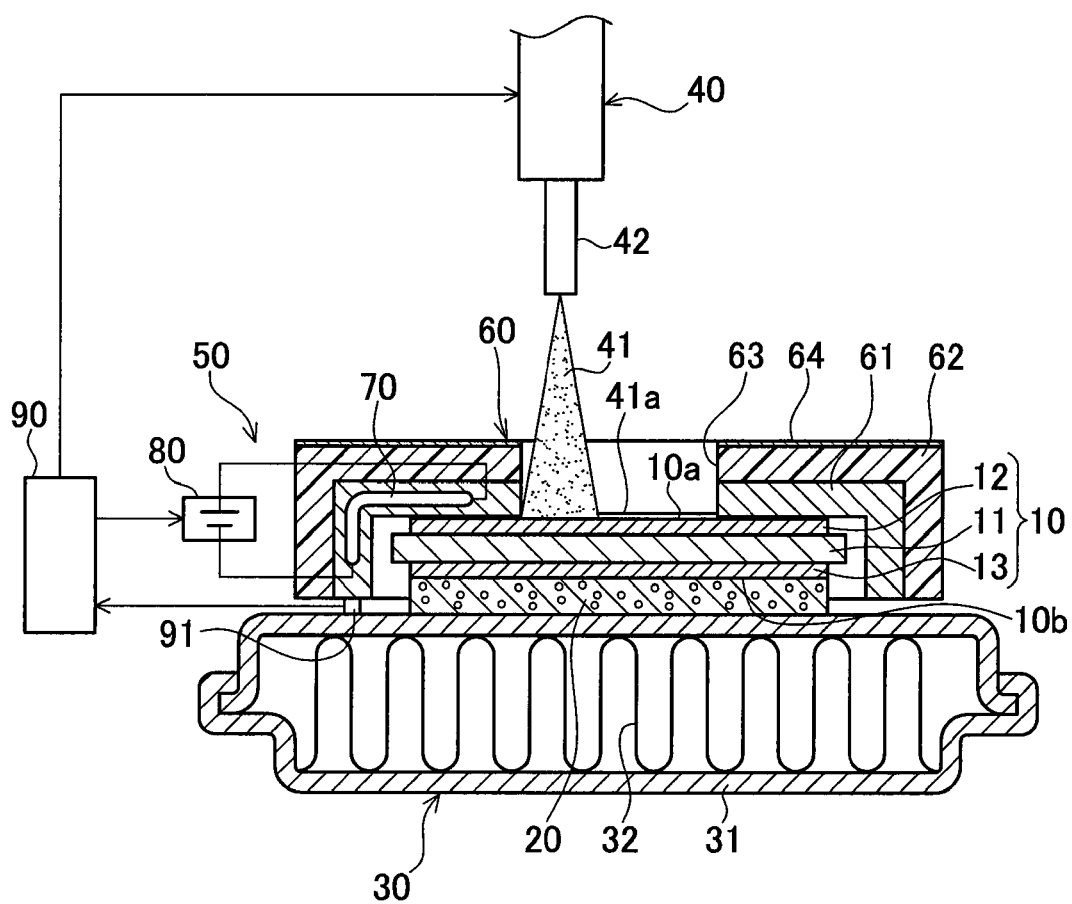
FIG. 1 is a schematic view of an overall structure showing a relationship among an insulating substrate, a cooler, a cold spray device, a substrate heating device, and others.

A detailed description of a preferred embodiment of a masking jig, a substrate heating device, and a coating method embodying the present invention will now be given referring to the accompanying drawings. FIG. 1 schematically shows a state where a coating made of material powder is formed on a front surface of a substrate by a cold spray method. FIG. 1 schematically shows an insulating substrate 10, a stress relaxation member 20, a cooler 30 serving as a radiator, a cold spray device 40 serving as a spray device, and a substrate heating device 50.

Figure 5:
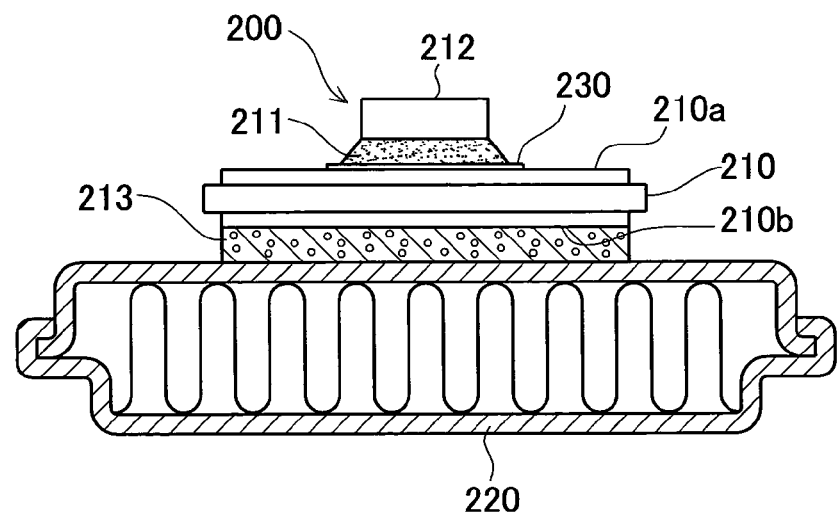
FIG. 5 is a structural view of a conventional power module.

The insulating substrate 10 serves to block electrical connection between a semiconductor device such as IGBT and the cooler 30 in a power module (for example, a power module 200 as shown in FIG. 5). This substrate 10 is configured in a three-layer structure consisting of an upper plate 12 and a lower plate 13, each made of pure aluminum, and a middle plate 11 made of aluminum nitride interposed therebetween. Thus, a front surface 10a and a back surface 10b of the substrate 10 are made of pure aluminum. The configuration of the substrate 10 is not limited to the above and may be appropriately modified or changed.

Figure 2:
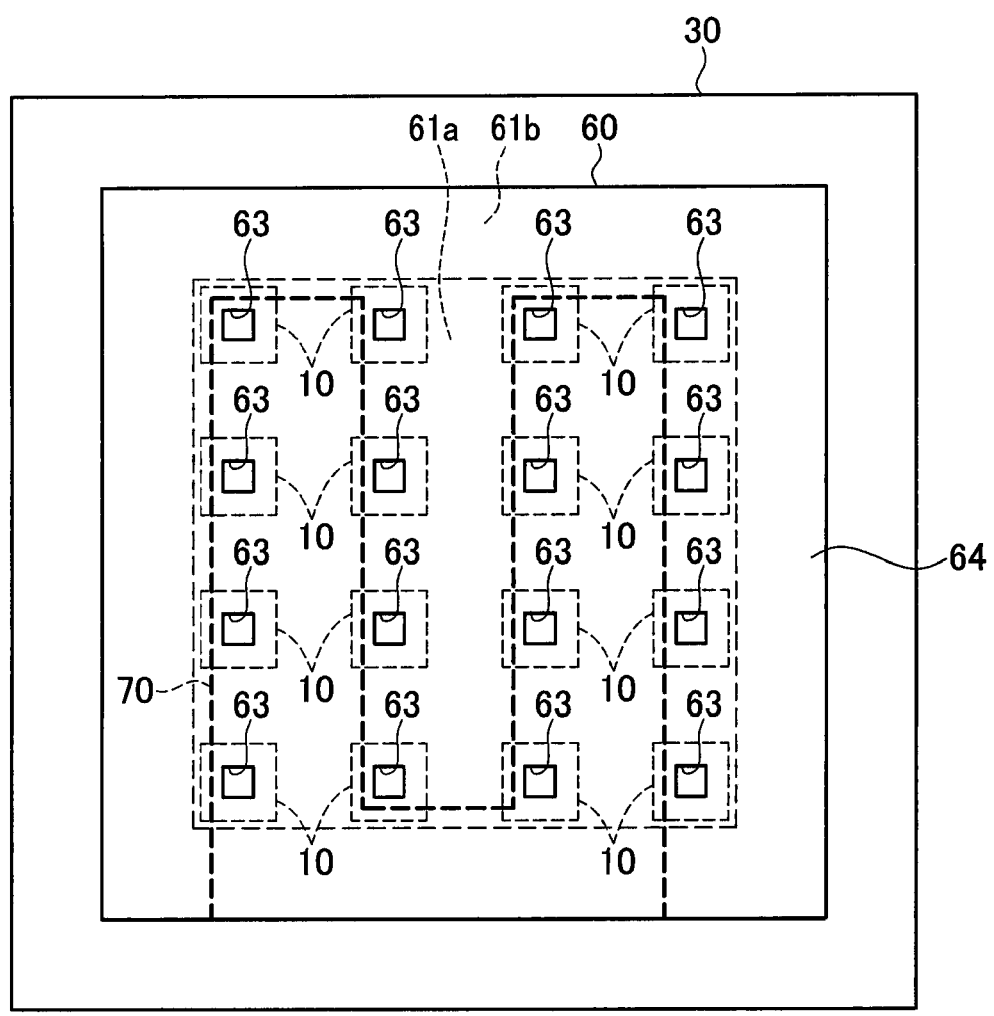
FIG. 2 is a plan view showing a relationship among a plurality of insulating substrates each having a back surface connected to the cooler, the masking jig, and a heating wire.

As shown in FIG. 2, a plurality (sixteen in FIG. 2) of the aforementioned insulating substrates 10 are placed on and connected to a single cooler 30 and entirely covered by a single masking jig 60. However, for easy explanation of the present embodiment, FIG. 1 schematically shows one of the insulating substrates 10 placed on and connected to the cooler 30.

The stress relaxation member 20 serves to prevent the insulating substrate 10 or a semiconductor device from being broken by thermal stress during manufacture of the power module by brazing or soldering. An upper surface of the stress relaxation member 20 is soldered to the back surface 10b of the substrate 10.

The cooler 30 serves to radiate the heat generated due to switching of the semiconductor device. This cooler 30 is coupled to the insulating substrate 10 through the stress relaxation member 20. Specifically, a case 31 of the cooler 30 is brazed to a lower surface of the stress relaxation member 20. A fin 32 is placed in the case 31 to form flow paths for allowing a cooling medium to flow therethrough.

Herein, a manufacturing process to join the semiconductor device to the front surface 10a of the insulating substrate 10 will be explained. The cooler 30 is connected in advance to the back surface 10b of the substrate 10 through the stress relaxation member 20. By use of the masking jig 60, copper powder 41 as material powder is sprayed from the cold spray device 40 onto the front surface 10a of the substrate 10. Thus, a coating 41a made of copper powder is formed on the front surface 10a of the substrate 10 and then the semiconductor device is joined onto the coating 41a by solder. It is to be noted that forming the coating 41a made of copper powder 41 onto the front surface 10a of the substrate 10 is intended to enhance solder wettability to facilitate joining of the semiconductor device to the front surface 10a of the substrate 10.

The cold spray device 40 is adapted to spray the copper powder 41 in solid state from a nozzle 42 at high velocities (e.g., 500 to 1000 m/s) together with working gas heated to a lower temperature than a melting point or a softening temperature of the copper powder 41. The cold spray device 40 is further configured to move in a planar direction of, or in a direction parallel to, the substrate 10 by a movement device not shown. The material powder to be sprayed is not limited to the copper powder 41 and may be a powder of copper alloy, aluminum, chrome, nickel, iron, or alloys of these materials.

The copper powder 41 to be sprayed is not heated up to a high temperature (e.g., 1000° C.) differently from a plasma spray process, a flame spray process, and others. It is therefore possible to prevent the property of the copper powder 41 from changing due to oxidization or the like and hence to form the coating 41a with high adhesion to the front surface 10a of the insulating substrate 10. The aforementioned working gas is to prevent the copper powder 41 from oxidizing and selectable from helium, nitrogen, air, or others.

Meanwhile, it is preferable that the insulating substrate 10 has been heated to a temperature ranging from 100° C. to 200° C. when the copper powder 41 collides against the front surface 10a of the substrate 10. This is to facilitate deformation of the copper powder 41 and the front surface 10a of the substrate 10 at the time of their collision, thereby enhancing an anchor effect and shear deformation. Thus, an adhesion rate of the copper powder 41 to the front surface 10a of the substrate 10 and adhesion strength thereof can be increased. And, the coating 41a of the copper powder 41 can be formed compactly.

However, in a case where the cooler 30 is connected in advance to the back surface 10b of the insulating substrate 10, the substrate 10 cannot be heated from the side of the back surface 10b. In another case where the substrate 10 is to be heated by radiation, the front surface 10a of the substrate 10 is less likely to be sufficiently heated and a large heat loss is caused by the cooler 30. On the other hand, in another case where the front surface 10a of the substrate 10 is to be heated by use of a laser, such expensive device is additionally needed and a low-cost structure cannot be achieved.

In this embodiment, therefore, a substrate heating device 50 is provided to heat the insulating substrate 10 from the side of the front surface 10a. This substrate heating device 50 includes the aforementioned masking jig 60, a heating wire 70, serving as a heating device, located internally in the masking jig 60, a power source 80 for supplying electric current to the heating wire 70, and an electronic control unit 90 serving as a control device for controlling the power source 80.

The masking jig 60 is arranged to specify a coating area which is a range in which the coating 41a is to be formed. The masking jig 60 is configured to cover the plurality of insulating substrates 10 as shown in FIG. 2. This masking jig 60 consists of a metal member 61 located inside and an insulating member 62 located on the outside of the metal member 61. The metal member 61 as a contact member is placed in surface contact with the front surfaces 10a of the substrates 10. The insulating member 62 serves to restrain heat transfer.

Figure 3:
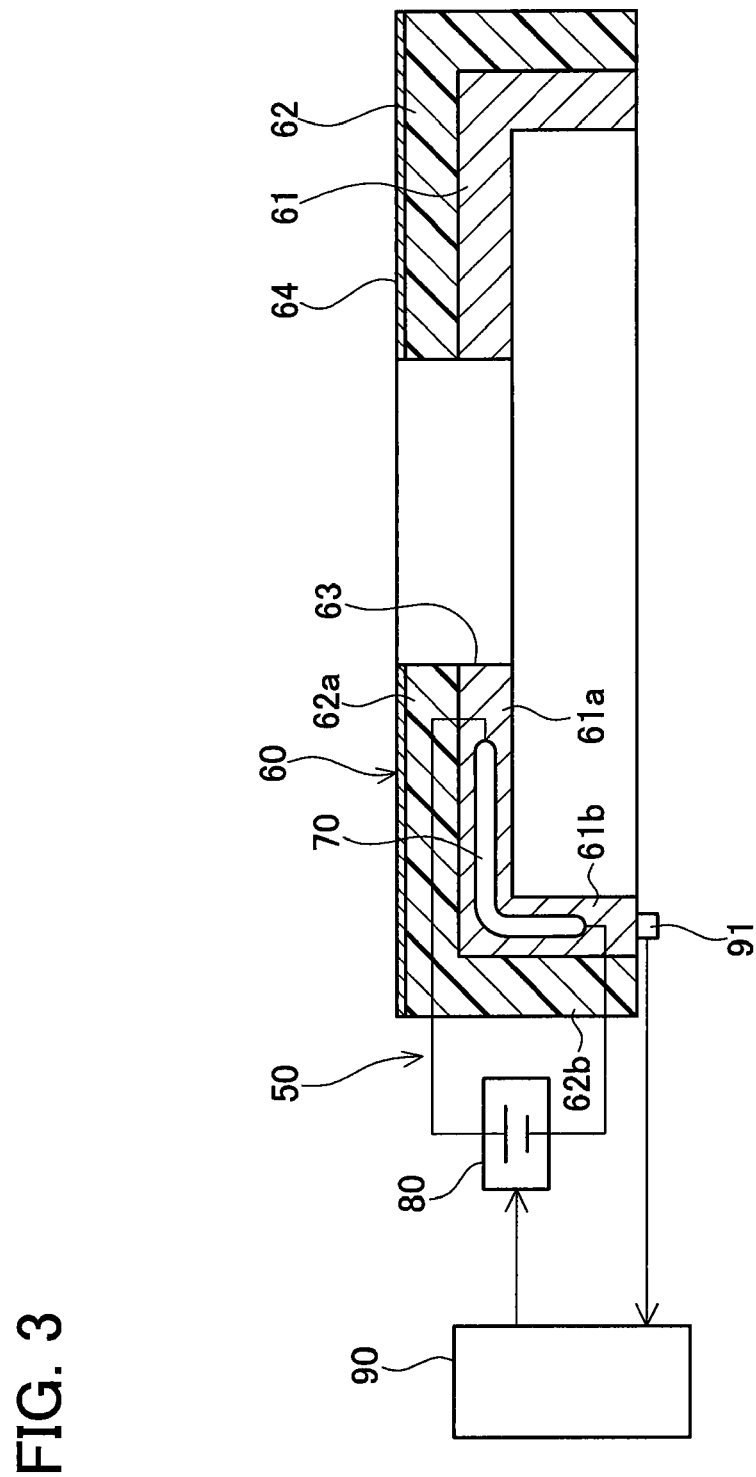
FIG. 3 is an enlarged view of the substrate heating device shown in FIG. 1.
Figure 4:
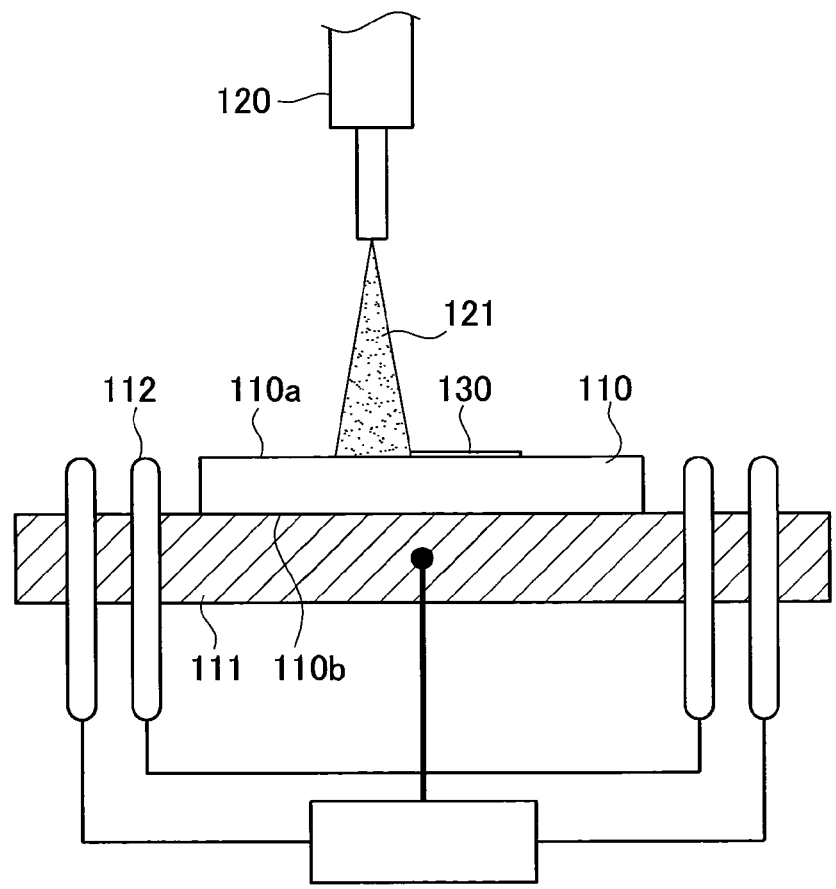
FIG. 4 is an explanatory view to show conventional operations in spraying material powder onto a heated substrate.

Further, the masking jig 60 is formed with a plurality of openings 63 individually corresponding to the substrates 10 as shown in FIG. 2 and also a protection film 64 on a front surface facing the cold spray device 40. Each opening 63 allows the copper powder 41 to pass through in a thickness direction of the substrates 10. In FIGS. 1 and 3, one of the openings 63 is schematically illustrated for simplifying explanation of the present embodiment.

The metal member 61 is arranged to heat the front surfaces 10a of the substrates 10 and internally includes the heating wire 70 capable of generating heat. Therefore, the metal member 61 is made of high thermal conductivity metal such as copper, aluminum, or others. This metal member 61 includes, as shown in FIG. 3, a planar portion 61a formed with the openings 63 and extending in the planar direction of the insulating substrates 10 and a side portion 61b extending from the peripheral edge of the planar portion 61a toward the cooler 30, in a thickness direction of the substrates 10.

The planar portion 61a of the metal member 61 is placed in surface contact with the entire front surface 10a of each insulating substrate 10 excepting each coating region so as to rapidly heat the front surfaces 10a of the substrates 10. In the case where each substrate 10 is in a slightly deformed or distorted state due to thermal stress or others, a part of the planar portion 61a of the metal member 61 may be placed in surface or point contact with a part of the front surface 10a of each substrate 10 in the vicinity of each opening 63.

The insulating member 62 prevents heat transfer from the heated metal member 61 to the protection film 64 (the surface of the masking jig 60). Accordingly, the insulating member 62 is made of a low thermal conductivity material such as glass, foamed plastic, and stainless steel. This insulating member 62 covers the entire metal member 61. The insulating member 62 includes a planar portion 62a formed with the openings 63 and extending in the planar direction of the insulating substrates 10 and a side portion 62b extending from the peripheral edge of the planar portion 62a toward the cooler 30, in the thickness direction of the substrates 10.

The planar portion 62a of the insulating member 62 is placed or layered over the planar portion 61a of the metal member 61 in the thickness direction of the insulating substrate 10 to prevent heat transfer to the entire protection film 64. This is for the following reason. If the protection film 64 is heated according to heat generation of the heating wire 70, the sprayed copper powder 41 is likely to adhere to the protection film 64 and then such adhered copper powder 41 is hard to remove. That is, the presence of the insulating member 62 in the masking jig 60 as mentioned above prevents the sprayed copper powder 41 from adhering to the protection film 64.

The side portion 61b of the metal member 61 and the side portion 62b of the insulating member 62 are not in contact with the cooler 30. This is to prevent direct heat transfer from the masking jig 60 to the cooler 30 during heating of the metal member 61. The side portion 61b of the metal member 61 surrounds the insulating substrates 10 so as to keep the heat generated by the heating wire 70 into the inside of the side portion 61b. The protection film 64 is a film formed of such a material as to prevent the copper powder 41 from adhering to the surface of the planar portion 62a of the insulating member 62, for example, a film made of ceramic, resin, or others to coat the surface of the planar portion 62a.

The heating wire 70 generates heat upon receipt of a current supplied from the power source 80. This heating wire 70 is placed in the planar portion 61a and the side portion 61b of the metal member 61 as schematically shown in FIG. 3. Thus, the metal member 61 is rapidly heated. In particular, a part of the heating wire 70 is located in the vicinity of the openings 63. By the heat generated by the heating wire 70, therefore, the portion corresponding to the coating region in the front surface 10a of each insulating substrate 10 can be heated quickly. The vicinity of each opening 63 is a portion of the metal member 61 that overlaps the substrates 10 in plan view.

In the case of the masking jig 60 formed with the plurality of openings 63 as shown in FIG. 2, the heating wire 70 is arranged in the planar portion 61a of the metal member 61 so as to form a meandering pattern passing the vicinity of each opening 63. In other words, the heating wire 70 is located to heat the vicinity of each opening 63. In this case, the heat generated in the heating wire 70 can quickly heat all the portions corresponding to the coating regions in the front surfaces 10a of the insulating substrates 10. A current value to be supplied from the power source 80 to the heating wire 70 is controlled by the electronic control unit 90.

The electronic control unit 90 is connected to the power source 80 and the cold spray device 40 as shown in FIG. 1 and changes the above current value based on the temperature of the metal member 61 detected by a temperature sensor 91 and the timing of spraying the copper powder 41 from the cold spray device 40. At the time when the copper powder 41 is sprayed to the front surfaces 10a of the insulating substrates 10, accordingly, the heating wire 70 has generated heat and thus the temperature of the metal member 61, that is, the temperature of the front surfaces 10a of the substrates 10 has reached a predetermined temperature T ° C. in a range from 100° C. to 200° C.

Meanwhile, the front surfaces 10a of the insulating substrates 10 need to be heated in advance to the predetermined temperature T ° C. only when the copper powder 41 is to be sprayed. In consideration of the time needed until the temperature of the front surfaces 10a of the substrates 10 is increased to the predetermined temperature T, the electronic control unit 90 controls the current value to cause the heating wire 70 to generate heat from just before the copper powder 41 is sprayed and also controls the current value not to cause the heating wire 70 to generate heat after the copper powder 41 is sprayed.

A coating method of forming the coating 41a of the copper powder 41 on the front surface 10a of each substrate 10 with the above structure will be explained below. Prior to spraying of the copper powder 41 from the cold spray device 40, the metal member 61 of the masking jig 60 is first placed in contact with the front surfaces 10a of all the insulating substrates 10 as shown in FIG. 2. The electronic control unit 90 then activates the heating wire 70 to heat the vicinity of each opening 63. While moving in the planar direction of the substrates 10, the cold spray device 40 sprays the copper powder 41 onto the front surface 10a of each heated substrate 10. The resultant coating 41a of the copper powder 41 is formed on the front surface 10a of each substrate 10.

The operations and advantages of the aforementioned embodiment are explained below.

When the coating 41a is to be formed of the copper powder 41 on the front surface 10a of each insulating substrate 10, the heating wire 70 located internally in the masking jig 60 heats the vicinity of each opening 63, thereby heating the front surface 10a of each substrate 10 in contact with the masking jig 60. Thus, while the back surfaces 10b of the substrates 10 are in connection with the cooler 30 and the front surfaces 10a of the substrates 10 are being heated by a low-cost structure, the copper powder 41 is sprayed by the cold spray device 40 onto the front surface 10a of each substrate 10. Consequently, an adhesion rate of the copper powder 41 to the front surfaces 10a of the substrates 10 and adhesion strength thereof can be enhanced and also the coating 41a of the copper powder 41 can be compactly formed.

The above embodiment is explained on the masking jig according to the invention, but the invention is not limited thereto. The invention may be embodied in other specific forms without departing from the essential characteristics thereof.

In the aforementioned embodiment, the heat generating device is embodied by the heating wire 70 but is not limited thereto. For instance, the heat generating device may be arranged to include a pipe passing through the metal member 61 of the masking jig 60 so that hot water or hot air circulates through the pipe to heat the front surfaces 10a of the insulating substrates 10.

In the above embodiment, the masking jig 60 is shaped to include the planar portions 61a and 62a and the side portions 61b and 62b, but is not limited thereto. For instance, the masking jig 60 may be shaped to include only the planar portions 61a and 62a. Although the heating wire 70 is arranged in a meandering pattern (see FIG. 2), the shape of the heating wire may be changed appropriately into, for example, a spiral form.

In the above embodiment, the protection film 64 is a film made on all over the surface facing the cold spray device 40. As an alternative, this protection film may be formed only in a peripheral portion around each opening 63 of the surface facing the cold spray device 40. Further, although the masking jig 60 is provided with the insulating member 62 and the protection film 64, the masking jig 60 may be configured without including insulating member 62 and the protection film 64.

In the above embodiment, the heating wire 70 heats the front surfaces 10a of the insulating substrates 10 to the predetermined temperature T ° C. in a range from 100° C. to 200° C. This predetermined temperature T ° C. may be changed appropriately according to changes in the material powder and the material of the substrate.

In the above embodiment, the coating method is embodied by the cold spray method. Instead of the cold spray method, for example, an aerosol deposition method may be adopted. This aerosol deposition method is a coating method for forming a film by mixing material powder (ceramics powder) which is fine powder in solid state with gas into an aerosol state and spraying this mixture onto a front surface of a substrate at room temperature.

REFERENCE SIGNS LIST

10 Insulating substrate
20 Stress relaxation member
30 Cooler
40 Cold spray device
41 Copper powder
41a Coating
50 Substrate heating device
60 Masking jig
61 Metal member
62 Insulating member
63 Opening
64 Protection film
70 Heating wire
80 Power source
90 Electronic control unit

The invention claimed is:

1. A coating method for forming a coating on a front surface of a substrate including a back surface connected to a radiator and constituting a power module by spraying material powder in solid state from a spray device onto the front surface of the substrate, the method comprising the steps of:
   placing a masking jig in contact with the front surface of the substrate, the masking jig being formed with an opening for specifying a coating region in which the coating is to be formed, the masking jig internally including a heat generating device to heat the vicinity of the opening;
   causing the heat generating device to heat the vicinity of the opening; and
   causing the spray device to spray the material powder onto the front surface of the heated substrate.

2. The coating method according to claim 1, wherein
the masking jig is formed with a plurality of the openings in correspondence with a plurality of the substrates connected to the single radiator, and
the heat generating device heats the vicinity of each opening.

3. A masking jig for specifying a coating region on a front surface of a substrate including a back surface connected to a radiator and constituting a power module, when a coating is to be formed in the coating region by spraying material powder in solid state from a spray device onto the surface, the masking jig comprising:
 a contact member formed with an opening to specify the coating region, the contact member being to be placed in contact with the front surface of the substrate, and the contact member internally including a heat generating device for heating the vicinity of the opening, wherein
 the contact member is formed with a plurality of the openings in correspondence with a plurality of the substrates connected to the single radiator, and
 the heat generating device is located to heat the vicinity of each opening.

4. The masking jig according to claim 3, wherein
an insulating member for restraining heat transfer is placed over the contact member in a direction of thickness of the substrate.

5. The masking jig according to claim 3, wherein
the contact member includes a planar portion formed with the opening and a side portion extending from the planar portion in the thickness direction of the substrate and surrounding the substrate, and
the heat generating device is placed in the planar portion and the side portion.

6. The masking jig according to claim 4, wherein
the contact member includes a planar portion formed with the opening and a side portion extending from the planar portion in the thickness direction of the substrate and surrounding the substrate, and
the heat generating device is placed in the planar portion and the side portion.

7. A substrate heating device for heating a substrate including a back surface connected to a radiator and constituting a power module when a coating is to be formed on a front surface of the substrate by spraying material powder in solid state from a spray device onto the surface, the heating device comprising:
 a masking jig includes a contact member formed with an opening for specify a coating region in which the coating is to be formed, the contact member being placed in contact with the front surface of the substrate, and a heating wire placed internally in the contact member to heat the vicinity of the opening;
 a power source for supplying current to the heating wire; and
 a control device for controlling the power source, wherein
 the contact member is formed with a plurality of the openings in correspondence with a plurality of the substrates connected to the single radiator, and
 the heat generating device is located to heat the vicinity of each opening.

* * * * *

UNITED STATES PATENT AND TRADEMARK OFFICE
CERTIFICATE OF CORRECTION

PATENT NO. : 8,414,977 B2  
APPLICATION NO. : 13/133271  
DATED : April 9, 2013  
INVENTOR(S) : Ikejiri It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 26 days.

Signed and Sealed this  
Thirteenth Day of August, 2013

Teresa Stanek Rea  
*Acting Director of the United States Patent and Trademark Office*